(12) United States Patent
Hokazono et al.

(10) Patent No.: US 10,298,223 B2
(45) Date of Patent: May 21, 2019

(54) SEMICONDUCTOR DEVICE DRIVING CIRCUIT (71) Applicant: Mitsubishi Electric Corporation, Tokyo (JP)

(72) Inventors: Kazuya Hokazono, Tokyo (JP); Akihisa Yamamoto, Tokyo (JP); Dong Wang, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/738,885

(22) PCT Filed: Dec. 18, 2015

(86) PCT No.: PCT/JP2015/085533
§ 371 (c)(1),
(2) Date: Dec. 21, 2017

(87) PCT Pub. No.: WO2017/104077
PCT Pub. Date: Jun. 22, 2017

(65) Prior Publication Data
US 2018/0198442 A1 Jul. 12, 2018

(51) Int. Cl.
*H03B 1/00* (2006.01)
*H03K 17/0812* (2006.01)
*H03K 17/30* (2006.01)
*H03K 17/082* (2006.01)

(52) U.S. Cl.
CPC ... *H03K 17/08128* (2013.01); *H03K 17/0828* (2013.01); *H03K 17/30* (2013.01)

(58) Field of Classification Search
CPC .... A61M 16/107; A61M 16/16; A61M 16/06; A61M 2016/0027; A61M 2202/0208
See application file for complete search history.

(56) References Cited

U.S. PATENT DOCUMENTS

| 6,320,275 B1 | 11/2001 | Okamoto et al. |
| 2013/0242438 A1 | 9/2013 | Fukuta et al. |
| 2016/0028219 A1 | 1/2016 | Habu et al. |

(Continued)

FOREIGN PATENT DOCUMENTS

| JP | 2000-023346 A | 1/2000 |
| JP | 2013-198185 A | 9/2013 |
| WO | 2014/115272 A1 | 7/2014 |

OTHER PUBLICATIONS

International Search Report issued in PCT/JP2015/085533, dated Jan. 19, 2016.

(Continued)

*Primary Examiner* — Sibin Chen
(74) *Attorney, Agent, or Firm* — Studebaker & Brackett PC (57) ABSTRACT

A semiconductor device driving circuit includes: a threshold adjustment circuit; a desaturation voltage detection circuit; and a drive circuit. The threshold adjustment circuit switches the threshold between a first voltage and a second voltage which is larger than the first voltage, outputs the first voltage as the threshold when the semiconductor switching device is in an off-state, and outputs the second voltage as the threshold when the semiconductor switching device is turned on and a voltage between the first electrode and the second electrode is a saturation voltage.

5 Claims, 6 Drawing Sheets (56) References Cited

U.S. PATENT DOCUMENTS

2016/0282407 A1* 9/2016 Bacigalupo ........ G01R 31/2621

OTHER PUBLICATIONS

Notification of Transmittal of Translation of the International Preliminary Report on Patentability (Chapter I) and Translation of Written Opinion of the International Searching Authority; PCT/JP2015/085533; dated Jun. 28, 2018.
An Office Action; "Notification of Reasons for Refusal," issued by the Japanese Patent Office on Feb. 26, 2019, which corresponds to Japanese Patent Application No. 2017-556300 and is related to U.S. Appl. No. 15/738,885; with English language translation.

* cited by examiner

SEMICONDUCTOR DEVICE DRIVING CIRCUIT

FIELD

The present invention relates to a semiconductor device driving circuit

BACKGROUND

Conventionally, for example, as disclosed in International Publication No. WO 2014/115272, a method for detecting a desaturation voltage of a semiconductor switching device is known as a short-circuit protection function of a semiconductor switching device. In general, when the semiconductor switching device is in an ON state, a voltage between terminals of the semiconductor switching device decreases and is stabilized at a minimum voltage. This minimum voltage is also referred to as a "saturation voltage". Specific examples of the "voltage between terminals" described herein include a collector-emitter voltage when the semiconductor switching device is, for example, an insulating gate bipolar transistor (IGBT), and a source-drain voltage when the semiconductor switching device is a MOSFET. When the semiconductor switching device is in a short-circuit state, the voltage between terminals of the semiconductor switching device increases from the saturation voltage due to overcurrent. When the voltage between terminals increases from the saturation voltage, the voltage becomes an abnormal voltage at which the voltage between terminals does not match the saturation voltage, i.e., a desaturation voltage. A short-circuit of the semiconductor switching device can be detected by detecting this desaturation voltage.

In a technique disclosed in International Publication No. WO 2014/115272, a high withstand diode and a high withstand capacitive element are provided between a semiconductor device driving circuit and a semiconductor switching device, and the capacitive element is charged when the semiconductor switching device is in a desaturation state, to detect that the semiconductor switching device is in the desaturation state. Specifically, when the capacitive element is charged by a constant current circuit, a voltage at a terminal VDSH increases. When the voltage at the terminal VDSH has reached a certain value or higher, it is determined that a desaturation voltage is generated in the semiconductor switching device.

CITATION LIST

Patent Literature

[PTL 1] International Publication No. WO 2014/115272

SUMMARY

Technical Problem

It can be considered that an ON operation of the semiconductor switching device is divided into a transition period and a steady period. The transition period represents a short period in which a turn-on operation of the semiconductor switching device is carried out. This transition period is also referred to as a "turn-on operation period". The turn-on operation period is a period in which a gate voltage rises from a low level to a high level when a drive signal rises, so that the semiconductor switching device changes from a cut-off state to a conductive state. On the other hand, the steady state is a state in which the gate voltage of the semiconductor switching device is stabilized at the high level after turn-on is completed, and a current is flowing to an output terminal of the semiconductor switching device. This steady period is also referred to as a "steady-on operation period".

The voltage between terminals of the semiconductor switching device during short-circuiting depends on the gate voltage and a short-circuit current to be input to the semiconductor switching device. At the same short-circuit current value, the voltage between terminals decreases as the gate voltage increases, and the voltage between terminals increases as the gate voltage decreases. Specifically, when a short-circuit occurs during the steady-on operation of the semiconductor switching device, the short-circuit state occurs in a state where the gate voltage is high, and thus the voltage between terminals has a small value. On the other hand, when the short-circuit state occurs immediately after the semiconductor switching device turns on, a gate drive signal before turn-on is at the low level, and thus the gate voltage is low. Accordingly, when the semiconductor switching device turns on during short-circuiting, the voltage between terminals is higher than that during the steady-on operation period.

When a short-circuit occurs in the semiconductor switching device, it is desirable to rapidly protect the semiconductor switching device. In order to protect the semiconductor switching device, it is preferable to variably set a threshold used in a circuit for detecting whether a short-circuit has occurred based on a desaturation voltage, in consideration of the above correlation between the gate voltage and the voltage between terminals. Specifically, it is preferable to set a threshold for the steady-on operation period to be smaller than a threshold for the turn-on operation period. In addition, in order to reduce a load on the semiconductor switching device during short-circuiting, it is preferable to rapidly cut off the semiconductor switching device when the voltage between terminals is small.

International Publication No. WO 2014/115272 discloses a method for switching the value of a constant current for charging a blanking capacitive element CB1 between the turn-on operation period and the steady-on operation period. According to this method, the speed for charging the blanking capacitive element CB1 during the transition period can be decreased and the speed for charging the blanking capacitive element CB1 during the steady period can be increased. Thus, rapid protection during the steady period can be achieved while preventing erroneous detection during the transition period. However, in order to lower a threshold for the ON operation period, it is necessary to adjust capacity or a charge current during the turn-on operation period, which causes a problem that the design of the circuit is complicated.

The present invention has been made in view of the above-mentioned problem, and an object of the present invention is to provide a semiconductor device driving circuit capable of variably setting a threshold used for detecting a desaturation voltage, without complicating the design of the semiconductor device driving circuit.

Solution to Problem

A semiconductor device driving circuit according to the first invention includes: a threshold adjustment circuit outputting a threshold; a desaturation voltage detection circuit acquiring a detection voltage increased at a predetermined increasing rate and determining whether the detection voltage is higher than the threshold when a voltage between a first electrode and a second electrode of a semiconductor switching device including the first electrode, the second electrode and a control electrode controlling conduction between the first electrode and the second electrode is a desaturation voltage; and a drive circuit generating a drive signal for driving the semiconductor switching device based on an input signal and maintaining the drive signal at a cut-off state when the desaturation voltage detection circuit determines that the detection voltage is higher than the threshold, wherein the threshold adjustment circuit switches the threshold between a first voltage and a second voltage which is larger than the first voltage, outputs the first voltage as the threshold when the semiconductor switching device is in an off-state, and outputs the second voltage as the threshold when the semiconductor switching device is turned on and a voltage between the first electrode and the second electrode is a saturation voltage.

A semiconductor device driving circuit according to the second invention includes: a detection circuit detecting a voltage between a first electrode and a second electrode of a semiconductor switching device including the first electrode, the second electrode and a control electrode controlling conduction between the first electrode and the second electrode; a threshold adjustment circuit outputting a threshold; a comparator comparing the threshold with a detection voltage detected by the detection circuit; and a drive circuit generating a drive signal for driving the semiconductor switching device based on an input signal and maintaining the drive signal at a cut-off state when the detection voltage increases from a value lower than the threshold and reaches the threshold, wherein the threshold adjustment circuit switches the threshold between a first voltage and a second voltage which is larger than the first voltage, outputs the first voltage as the threshold when the semiconductor switching device is in an off-state, and outputs the second voltage as the threshold when the semiconductor switching device is turned on and a voltage between the first electrode and the second electrode is a saturation voltage.

Advantageous Effects of Invention

In the present invention, the threshold adjustment circuit switches the first voltage and the second voltage. The threshold adjustment circuit selects the first voltage or the second voltage as the magnitude of the threshold in accordance with the state of the semiconductor switching device. Therefore, a threshold used for detecting a desaturation voltage can be variably set without complicating the design of the semiconductor device driving circuit.

DESCRIPTION OF EMBODIMENTS

First Embodiment

Figure 1:
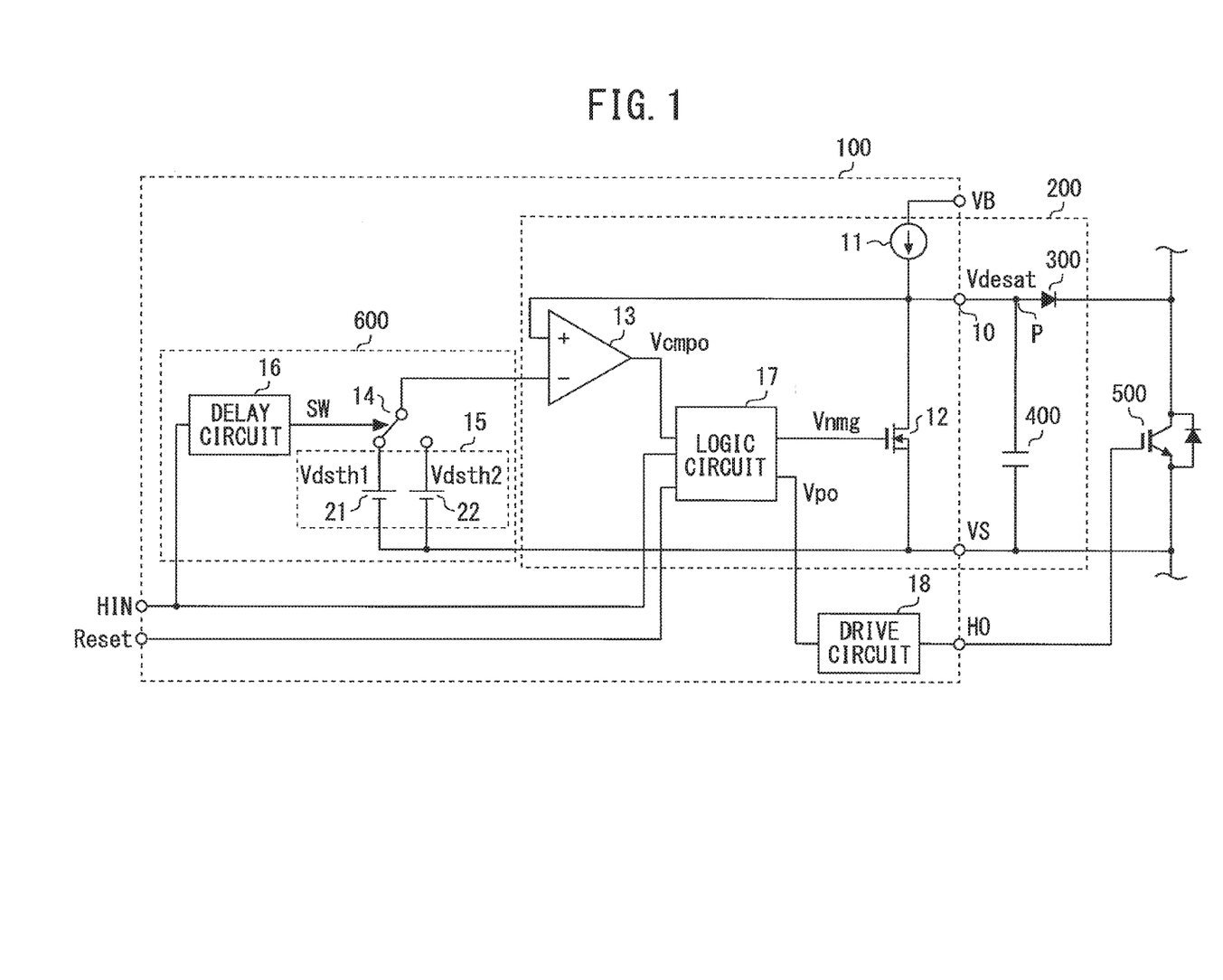
FIG. 1 is a circuit diagram illustrating a configuration of a semiconductor device driving circuit according to a first embodiment of the present invention.

FIG. 1 is a circuit diagram illustrating a configuration of a semiconductor device driving circuit 100 according to a first embodiment of the present invention. The semiconductor device driving circuit 100 is provided in the form of an integrated circuit, and is also referred to as an "integrated circuit 100". FIG. 1 illustrates specific examples of the integrated circuit 100 and peripheral circuits thereof. The integrated circuit 100 outputs a drive signal HO for driving a semiconductor switching device 500. The integrated circuit 100 includes a constant current source 11, a discharging NMOSFET 12, a comparator 13, a logic circuit 17, a drive circuit 18, and a threshold adjustment circuit 600. The constant current source 11, the discharging NMOSFET 12, the comparator 13, and the logic circuit 17, which are provided in the integrated circuit 100, and a diode 300 and a capacitive element 400, which are provided outside the integrated circuit 100, constitute a desaturation voltage detection circuit 200. The desaturation voltage detection circuit 200 is a circuit part which detects that the voltage between terminals of the semiconductor switching device 500 is a desaturation voltage, and is configured by a well-known technique. For example, a circuit configuration and a circuit operation similar to those of the desaturation voltage detection circuit 200 are also disclosed in International Publication No. WO 2014/115272. Accordingly, detailed descriptions of the basic circuit operation and the like belonging to well-known techniques are omitted.

In the first embodiment, an insulating gate bipolar transistor (IGBT) is used as a specific example of the semiconductor switching device 500, but instead a semiconductor switching device other than an IGBT may also be used as a modified example. For example, a MOSFET may also be used. In the case of FIG. 1, the semiconductor switching device 500 is an IGBT. Accordingly, the voltage between terminals of the semiconductor switching device 500 is a collector-emitter voltage. Silicon may also be used as a material for the semiconductor switching device 500. As the material for the semiconductor switching device 500, so-called wide bandgap semiconductor having a band gap wider than that of silicon may be used. Specifically, SiC, GaN, or diamond may be used.

The logic circuit 17 receives an input signal HIN and an output signal Vcmpo from the comparator 13. The logic circuit 17 outputs the output signal Vnmg to the discharging NMOSFET 12, and outputs an output signal Vpo to the drive circuit 18. Specifically, when the output signal Vcmpo from the comparator 13 is at the low level, the logic circuit 17 sets the signal Vpo as a signal synchronous with the input signal HIN, and sets a signal Vnmg as a signal synchronous with the inverted signal of the input signal HIN.

Further, when the input signal HIN becomes a high level and the signal Vcmpo becomes the high level, the logic circuit 17 sets the signal Vpo to a low level in synchronization with a rising edge of the signal Vcmpo which has become the high level, and sets the signal Vnmg to the high level. A state where the signal Vpo is set to the low level and the signal Vnmg is set to the high level is preferably held until a predetermined signal is input, and this state may be released when a signal Reset illustrated in FIG. 1 is input to the integrated circuit 100. The predetermined signal Reset is not limited to the mode in which the integrated circuit 100 is provided with a Reset terminal and the signal is input from the outside of the integrated circuit 100. A circuit for generating the signal Reset may be provided in the integrated circuit 100.

The integrated circuit 100 includes a desaturation detection terminal 10. The desaturation detection terminal 10 is connected to a node P between a positive terminal of the capacitive element 400 and an anode of the diode 300. A voltage to be applied to the node P is a detection voltage Vdesat which is used to detect a desaturation voltage in the first embodiment. The desaturation detection terminal 10 is connected to the node P, thereby enabling acquisition of the detection voltage Vdesat.

A plus terminal of the comparator 13 receives the detection voltage Vdesat input from the desaturation detection terminal 10, and a minus terminal of the comparator 13 receives the threshold output from the threshold adjustment circuit 600. The comparator 13 outputs a high level signal when the detection voltage Vdesat is higher than the threshold, and outputs a low level signal when the detection voltage Vdesat is lower than the threshold.

The discharging NMOSFET 12 is driven by an input signal Vnmg from the logic circuit 17. When the signal Vnmg is at the high level, the discharging NMOSFET 12 is turned on and discharges the capacitive element 400 to lower the detection voltage Vdesat.

The constant current source 11 supplies the desaturation detection terminal 10 with a constant current. When the discharging NMOSFET 12 is in the off state, the capacitive element 400 is charged with a current supplied from the constant current source 11, so that the detection voltage Vdesat increases.

Figure 2:
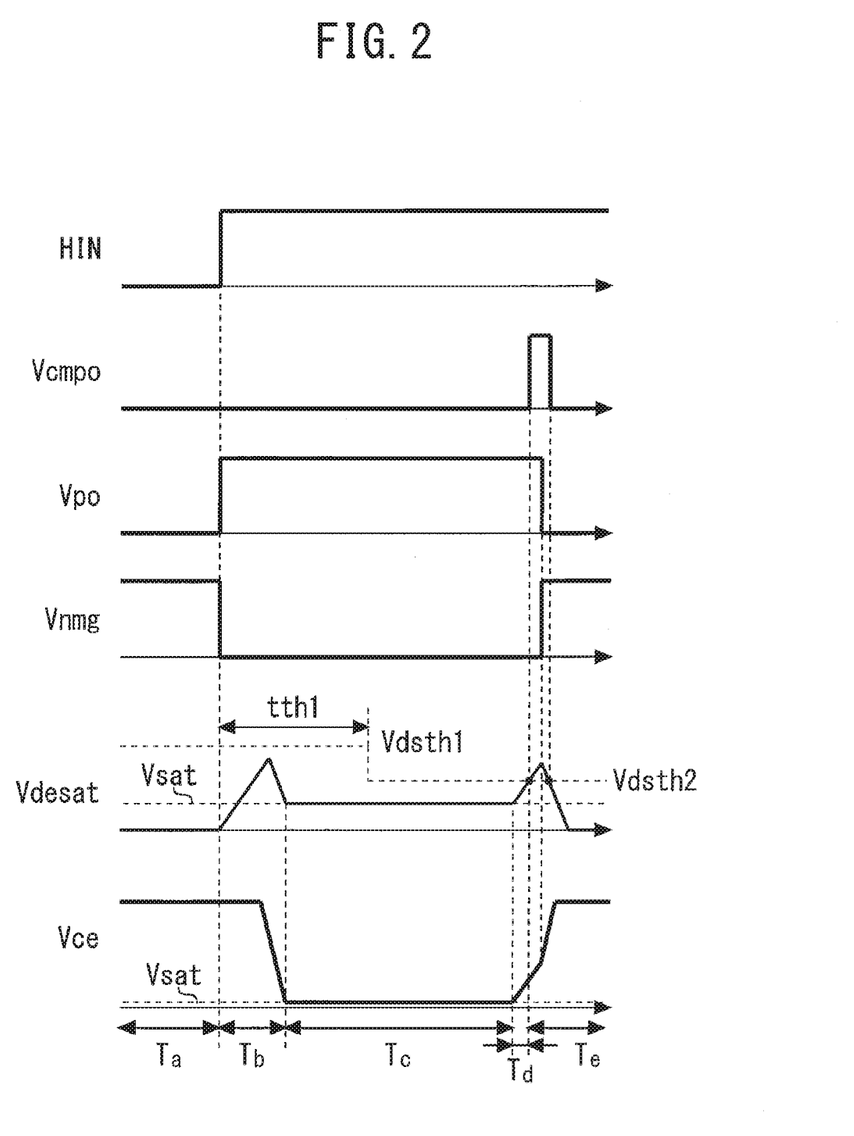
FIG. 2 is a time chart illustrating the operation of the semiconductor device driving circuit according to the first embodiment of the present invention.

A cathode terminal of the diode 300 is connected to a high-potential-side terminal of the semiconductor switching device 500, and an anode terminal of the diode 300 is connected to the desaturation detection terminal 10. When the voltage between terminals of the semiconductor switching device 500 is a saturation voltage Vsat, the diode 300 clamps the voltage of the desaturation detection terminal 10 to the saturation voltage Vsat. This clamping prevents the constant current source 11 from excessively charging the capacitive element 400. Note that the saturation voltage Vsat is schematically illustrated in FIG. 2. The semiconductor switching device 500 is turned on and a collector-emitter voltage Vce of the semiconductor switching device 500 decreases and is stabilized at a minimum voltage. This minimum voltage is referred to as a "saturation voltage Vsat".

When the semiconductor switching device 500 is in a short-circuit state, the collector-emitter voltage Vce increases due to overcurrent, and the detection voltage Vdesat also increases in accordance with the collector-emitter voltage. This mechanism is described below. When the collector-emitter voltage Vce of the semiconductor switching device 500 becomes a desaturation voltage, the voltage of the capacitive element 400 is not clamped to the saturation voltage Vsat. Specifically, when the collector-emitter voltage Vce becomes a desaturation voltage, the cathode-side potential of the diode 300 increases in accordance with the collector-emitter voltage, and a constant current from the constant current source 11 flows to the capacitive element 400. When the magnitude of the constant current from the constant current source 11 is determined, the charging rate of the capacitive element 400 is determined. When the constant current is supplied, the capacitive element 400 is further charged at a constant charging rate. Then, when the charge voltage of the capacitive element 400 exceeds the threshold input to the comparator 13, an occurrence of a short-circuit is detected. Thus, according to the desaturation voltage detection circuit 200, when a desaturation voltage is generated, the voltage across the both ends of the capacitive element 400, i.e., the detection voltage Vdesat, can be increased at a predetermined increasing rate. The desaturation voltage detection circuit 200 can also determine whether the detection voltage Vdesat is higher than the threshold input to the comparator 13.

The drive circuit 18 receives the signal Vpo and generates the drive signal HO for driving the semiconductor switching device 500. As described above, the logic circuit 17 changes the content of the signal Vpo according to the high level or low level of the input signal HIN and the output signal Vcmpo. When the signal Vpo transmits the ON/OFF state in synchronization with the input signal HIN, the drive signal HO is turned on or off according to the input signal HIN. On the other hand, when the signal Vpo is held at the low level, the drive signal HO is also held at the low level, and the semiconductor switching device 500 is maintained at the cut-off state.

The threshold adjustment circuit 600 generates a voltage signal used as the threshold to be input to the comparator 13. The threshold adjustment circuit 600 includes a delay circuit 16, a switch 14, and a threshold source 15. The threshold adjustment circuit 600 switches the switch 14 by the output from the delay circuit 16, to thereby switch the connection state between the threshold source 15 and the comparator 13. Thus, the threshold to be input to the comparator 13 can be variably set.

The delay circuit 16 causes a switch signal SW to rise to the high level after a lapse of a predetermined first delay time tth1 from a rising edge of the input signal HIN. The first delay time tth1 of the delay circuit 16 is set to a length of time equal to or longer than a time required for lowering the collector-emitter voltage Vce of the semiconductor switching device 500 to a voltage equivalent to the saturation voltage Vsat. The first delay time tth1 of the delay circuit 16 is set to be longer than a blanking time set in the desaturation voltage detection circuit 200. Note that setting of "blanking time" is a well-known technique, and thus the detailed description thereof is omitted. Roughly speaking, a "blanking time" is set in a desat detection function so as not to erroneously detect the desaturation voltage state immediately after the semiconductor switching device 500 is turned on as an occurrence of a short-circuit. Even when the desaturation voltage is detected, an occurrence of a short-circuit is not immediately detected, but instead when the time when the desaturation voltage is detected in the on-state after turn-on exceeds the blanking time, an occurrence of a short-circuit can be detected.

The switch 14 switches the electrical connection between a voltage source 21 and a voltage source 22 according to the switch signal SW output from the delay circuit 16. The switch 14 electrically connects the first voltage source 21 and the comparator 13 when the switch signal SW output from the delay circuit 16 is at a low level, and electrically connects the second voltage source 22 and the comparator 13 when the switch signal SW output from the delay circuit 16 is at the high level.

The threshold source 15 includes the first voltage source 21 and the second voltage source 22. The first voltage source 21 supplies a first threshold Vdsth1, and the second voltage source 22 supplies a second threshold Vdsth2. The second threshold Vdsth2 is lower than the first threshold Vdsth1. The first threshold Vdsth1 is used as a threshold for the off operation period and the turn-on operation period of the semiconductor switching device 500, and the second threshold Vdsth2 is used as a threshold for the steady-on operation period of the semiconductor switching device 500.

In the integrated circuit 100, after a lapse of a predetermined period from a rising edge of the input signal HIN, i.e., in the steady-on operation period in which the collector-emitter voltage Vce of the semiconductor switching device 500 corresponds to the saturation voltage Vsat, the value of the voltage to be supplied to the comparator 13 is switched from the first threshold Vdsth1 to the second threshold Vdsth2. By this operation, the threshold for the turn-on operation period is set to a high level, and the threshold for the steady-on operation period can be set to a low level. As a result, rapid protection against a short-circuit in the steady-on operation period can be achieved while preventing erroneous detection of a short-circuit in the turn-on operation period.

By setting the threshold for the steady-on operation period to a low level, an occurrence of a desaturation voltage can be detected promptly when the collector-emitter voltage Vce is low. Accordingly, the semiconductor switching device 500 can be rapidly protected during occurrence of a short-circuit. As a result, a load on the semiconductor switching device 500 can be suppressed.

Figure 3:
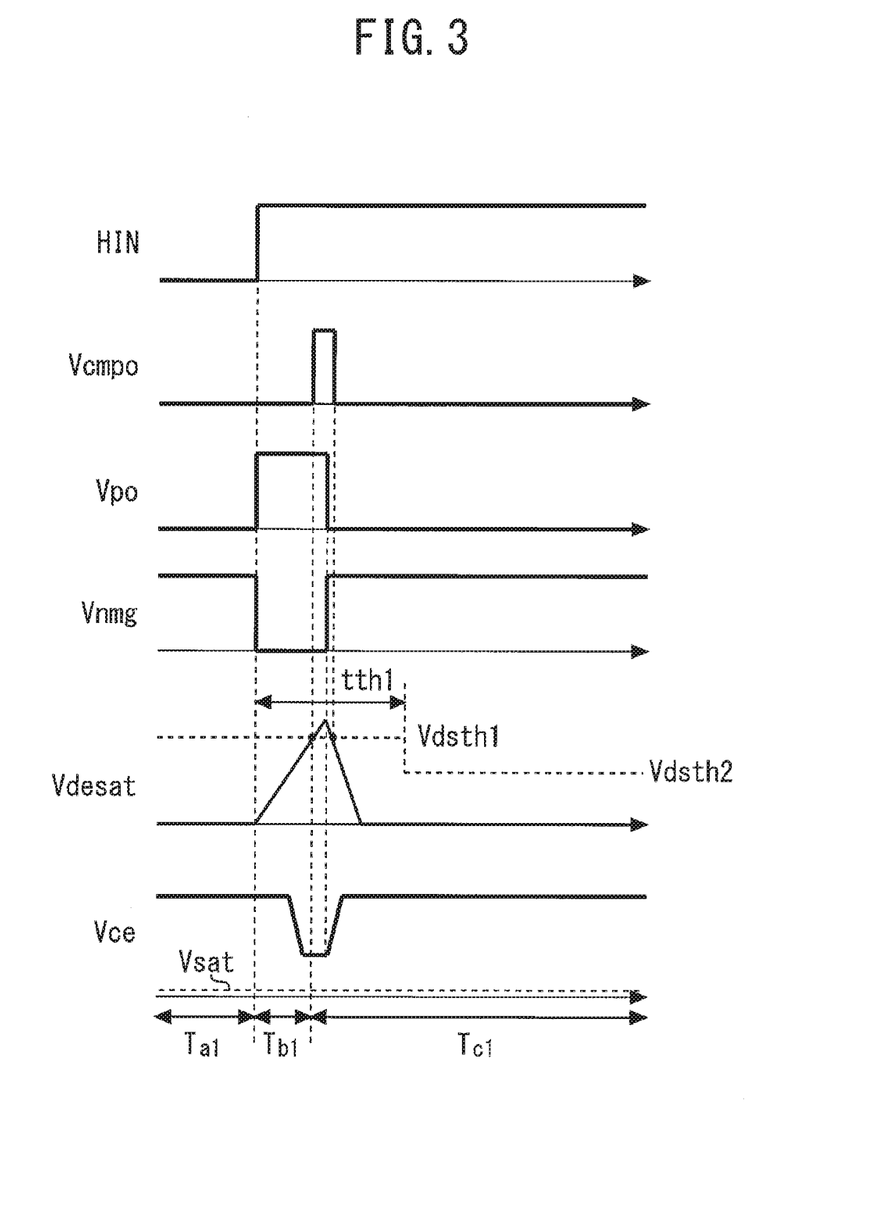
FIG. 3 is a time chart illustrating the operation of the semiconductor device driving circuit according to the first embodiment of the present invention.

The circuit operation of the first embodiment will be described with reference to specific time charts. FIGS. 2 and 3 are time charts each illustrating the operation of the semiconductor device driving circuit 100 according to the first embodiment of the present invention.

FIG. 2 illustrates a time chart when a short-circuit occurs in the semiconductor switching device 500 during the ON operation.

In a period Ta, the input signal HIN is at the low level and the semiconductor switching device 500 is in the off-state. In the period Ta, the input signal HIN is at the low level and the semiconductor switching device 500 is not turned on. Accordingly, the collector-emitter voltage Vce is a desaturation voltage. Since the input signal HIN is at the low level and the discharging NMOSFET 12 is in the on-state, the capacitive element 400 is not charged and thus the detection voltage Vdesat does not increase.

A period Tb is a period in which the input signal HIN rises to allow the semiconductor switching device 500 to turn on and the collector-emitter voltage Vce decreases to the saturation voltage Vsat. The period Tb corresponds to the transition period, i.e., "turn-on operation period". When the input signal HIN is at the high level, the logic circuit 17 turns off the discharging NMOSFET 12, and the capacitive element 400 is charged by the constant current source 11, so that the detection voltage Vdesat increases. At this time, during a time in which the collector-emitter voltage Vce decreases to the saturation voltage Vsat after turn-on, the current value of the constant current source 11, the capacitance value of the capacitive element 400, and the threshold Vdsth1 are set in such a manner that the detection voltage Vdesat does not exceed the first threshold Vdsth1. This corresponds to setting of the "blanking time". Even when the desaturation voltage is detected, an occurrence of a short-circuit is not immediately detected, but instead when the time when the desaturation voltage is detected in the on-state after turn-on exceeds the blanking time, an occurrence of a short-circuit can be detected.

A period Tc is a period in which the input signal HIN is at the high level and the collector-emitter voltage Vce corresponds to the saturation voltage Vsat. The period Tc corresponds to the steady period, i.e., "steady-on operation period". In the period Tc, the steady-on operation is carried out. At a time when the predetermined first delay time tth1 has elapsed after the input signal HIN rises, the threshold output from the threshold adjustment circuit 600 is switched from the first threshold Vdsth1 to the second threshold Vdsth2.

A period Td is a period in which the detection voltage Vdesat reaches the second threshold Vdsth2 after a short-circuit occurs during the steady-on operation. When the semiconductor switching device 500 is in the short-circuit state, the collector-emitter voltage Vce increases due to overcurrent, the detection voltage Vdesat also increases in accordance with the collector-emitter voltage.

A period Te is a period in which the detection voltage Vdesat reaches the second threshold Vdsth2 and the semiconductor switching device 500 performs the cut-off operation. When the detection voltage Vdesat reaches the second threshold Vdsth2, the output signal Vcmpo of the comparator 13 becomes the high level. When the output signal Vcmpo becomes the high level, the logic circuit 17 sets the signal Vpo to the low level and sets the signal Vnmg to the high level. When the signal Vpo is at the low level, the output signal from the drive circuit 18 is held at the low level. Thus, the semiconductor switching device 500 becomes the cut-off state. Further, when the discharging NMOSFET 12 is turned on in response to the signal Vnmg which has become the high level, the detection voltage Vdesat decreases. When the detection voltage Vdesat is lower than the second threshold Vdsth2, the signal Vcmpo becomes the low level. Even when the signal Vcmpo becomes the low level, the signal Vpo and the signal Vnmg are held in the state without changing. This held state may be released when a predetermined condition is satisfied, and may be reset, for example, when the signal Reset is input to the integrated circuit 100.

FIG. 3 illustrates a time chart when the semiconductor switching device 500 becomes the short-circuit state immediately after the semiconductor switching device 500 is turned on.

A period Ta1 is a period in which the input signal BIN is at the low level and the semiconductor switching device 500 is in the off-state.

A period Tb1 is a period in which the input signal BIN rises and the detection voltage Vdesat reaches the first threshold Vdsth1. The detection voltage Vdesat increases in accordance with a decrease in the collector-emitter voltage Vce.

A period Tc1 is a period in which the detection voltage Vdesat reaches the first threshold Vdsth1 and the semiconductor switching device 500 performs the cut-off operation.

As described above, according to the first embodiment, in the desaturation voltage detection circuit 200 of the semiconductor switching device 500, the second threshold Vdsth2 used when the semiconductor switching device 500 is in the steady ON state can be set to be lower than the first threshold Vdsth1 used during the off-state and the turn-on operation. Thus, it is possible to prevent erroneous detection during the turn-on operation period and also improve the sensitivity for detecting a short-circuit during the steady-on operation. The threshold for the steady-on period is set to be lower than the threshold for the transition period (turn-on operation period), thereby achieving rapid protection during the steady-on operation period, while preventing erroneous detection during the turn-on operation period. Further, by setting the threshold for the steady-on operation period to a low level, a short-circuit can be detected when the voltage between terminals is low, and the semiconductor switching device 500 can be rapidly protected during occurrence of a short-circuit, which leads to a reduction in load on the semiconductor switching device 500. Setting of the thresholds for the turn-on operation period and the steady-on operation period by using the two independent first and second voltage sources 21 and 22 facilitates design.

According to the first embodiment, the provision of the delay circuit 16 enables reduction of the threshold to be input to the comparator 13 after a lapse of the predetermined period after the signal for driving the semiconductor switching device 500 rises. The integrated circuit 100 according to the first embodiment has another advantage that the circuit operation is simple.

Second Embodiment

Figure 4:
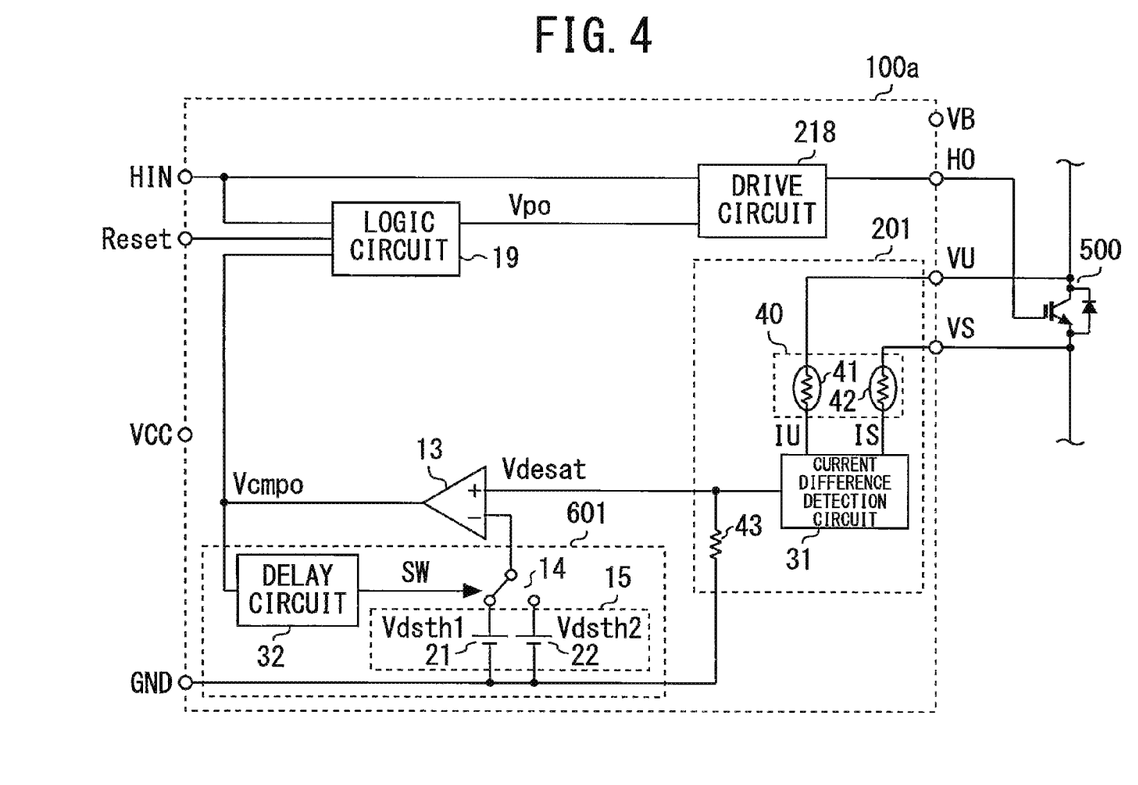
FIG. 4 is a circuit diagram illustrating a configuration of a semiconductor device driving circuit according to a second embodiment of the present invention.

FIG. 4 is a circuit diagram illustrating a configuration of a semiconductor device driving circuit 100a according to a second embodiment of the present invention. The semiconductor device driving circuit 100a is provided in the form of an integrated circuit and is hereinafter also referred to as an "integrated circuit 100a".

In the second embodiment, the detection voltage Vdesat used for detecting the desaturation voltage is generated by a method different from that of the first embodiment. Specifically, in the integrated circuit 100a illustrated in FIG. 4, the collector-emitter voltage Vce of the semiconductor switching device 500 is converted into a current by a first resistor 41 and a second resistor 42. A voltage signal is generated from a difference between converted currents, and the voltage signal is treated as the detection voltage Vdesat. A desaturation voltage detection circuit 201 according to the second embodiment detects the desaturation voltage of the collector-emitter voltage Vce by using the detection voltage Vdesat based on the current difference. The desaturation voltage detection circuit 201 adjusts the threshold to be compared with the detection voltage Vdesat. Note that in the first embodiment, the threshold is switched after a lapse of a predetermined period after completion of switching the input signal, while in the second embodiment, when the collector-emitter voltage Vce is equal to or less than a predetermined voltage, the threshold can be switched.

The integrated circuit 100 includes the comparator 13, a drive circuit 218, a logic circuit 19, a desaturation voltage detection circuit 201, and a threshold adjustment circuit 601.

Figure 5:
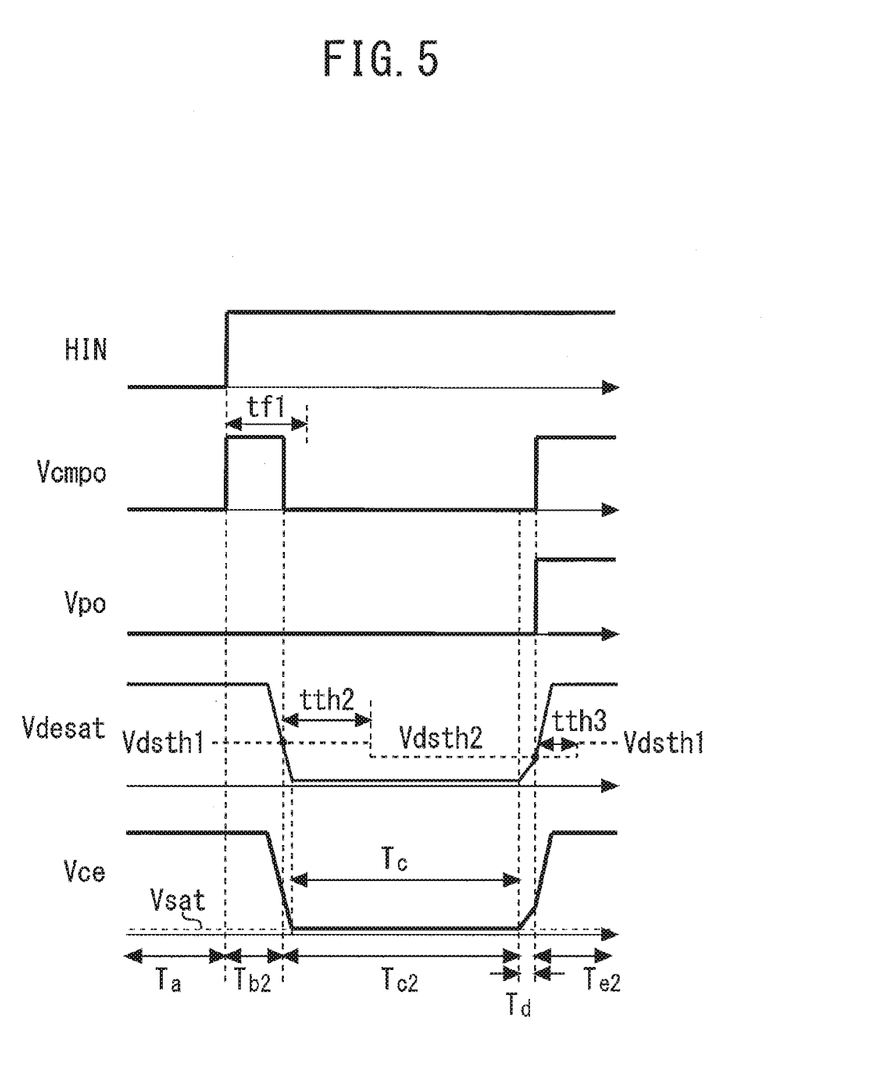
FIG. 5 is a time chart illustrating the operation of the semiconductor device driving circuit according to the second embodiment of the present invention.
Figure 6:
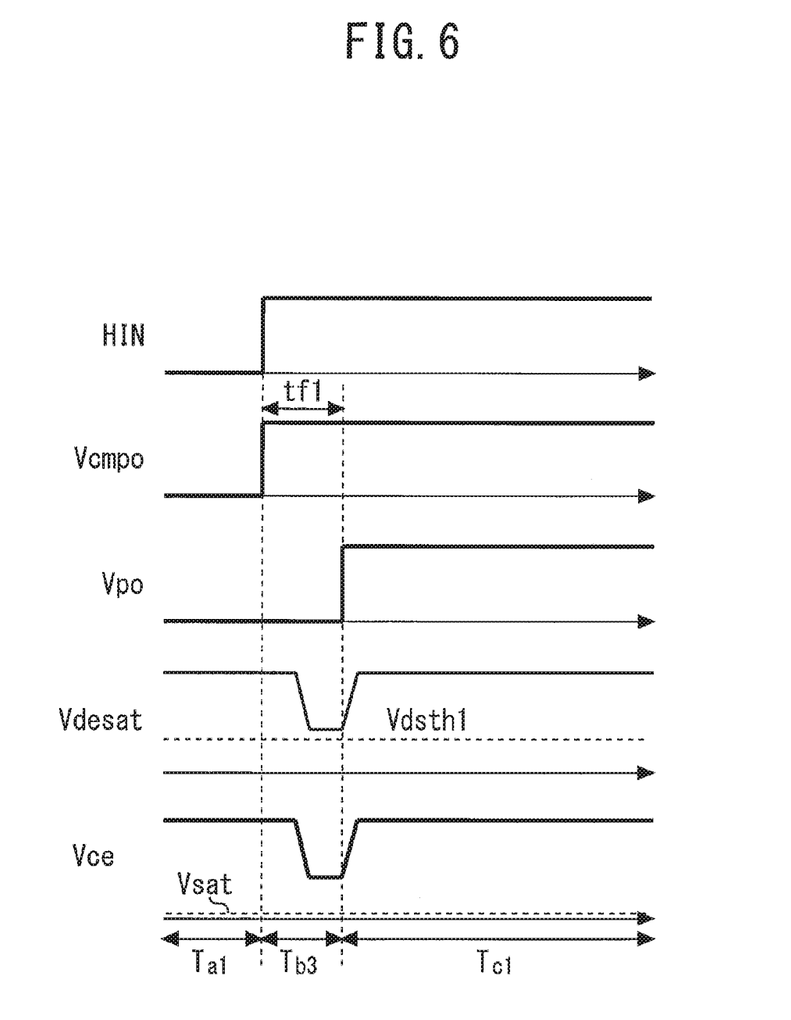
FIG. 6 is a time chart illustrating the operation of the semiconductor device driving circuit according to the second embodiment of the present invention.

The desaturation voltage detection circuit 201 includes a resistor unit 40 that is composed of the first resistor 41 and the second resistor 42. The first resistor 41 converts a voltage at a terminal VU into a current IU. The second resistor 42 converts a voltage at a terminal VS into a current IS. In the desaturation voltage detection circuit 201, the current difference detection circuit 31 detects a difference between the current IU and the current IS, and the third resistor 43 converts the current difference into the detection voltage Vdesat. The detection voltage Vdesat is a voltage difference between the terminal VU and the terminal VS, in other words, the voltage corresponding to the collector-emitter voltage. As illustrated in FIGS. 5 and 6 described below, the detection voltage Vdesat varies in accordance with the collector-emitter voltage Vce.

The threshold adjustment circuit 601 is a circuit that adjusts the reference voltage to be input to the comparator 13. The threshold adjustment circuit 601 switches the switch 14 by the output signal Vcmpo from the comparator 13, and switches the first voltage source 21 and the second voltage source 22. Switching from the first voltage source 21 to the second voltage source 22 corresponds to the following circuit operation. First, after a lapse of a predetermined period due to a delay of the delay circuit 32 after the signal Vcmpo falls to the low level, the switch signal SW is transmitted to the switch 14. In response to this switch signal SW, the connection destination of the switch 14 is switched from the first voltage source 21 to the second voltage source 22. Thus, the reference voltage to be input to the comparator 13 is switched from the first threshold Vdsth1 to the second threshold Vdsth2. Switching from the second voltage source 22 to the first voltage source 21 corresponds to the following circuit operation. First, after a lapse of a predetermined period due to a delay of the delay circuit 32 after the signal Vcmpo rises, the switch signal SW is transmitted to the switch 14. In response to the switch signal SW, the switch 14 is switched from the second voltage source 22 to the first voltage source 21. Thus, the reference voltage to be input to the comparator 13 is switched from the second threshold Vdsth2 to the first threshold Vdth1.

The logic circuit 19 receives the input signal HIN and the output signal Vcmpo of the comparator 13. The logic circuit 19 is a circuit that outputs the signal Vpo, and sets the signal Vpo to the high level when the input signal HIN is at the high level and the signal Vcmpo is at the high level. When at least one of the input signal HIN and the signal Vcmpo is at the low level, the logic circuit 19 sets the signal Vpo to the low level. A state where the signal Vpo is set to the high level is preferably held until a predetermined signal is input, and this state is held until the signal Reset is input from the outside in FIG. 4. As a modified example, as described in the first embodiment, a circuit for generating the predetermined signal Reset may be provided in the integrated circuit 100a.

When the input signal HIN rises, a certain period of time is required from the time when the input signal HIN rises until the time when the semiconductor switching device 500 becomes the saturation state. In this case, in order to prevent erroneous detection, a filter having a filter time tf1 is inserted (see FIGS. 5 and 6). The filter having the filter time tf1 is achieved by a filter function provided in the logic circuit 19. Also when a condition that the input signal HIN is at the high level and the signal Vcmpo is at the high level is satisfied, the logic circuit 19 holds the signal Vpo at the low level during the period of the filter time tf1, instead of immediately setting the signal Vpo to the high level. Thus, it is possible to prevent the signal Vcmpo from rising to the high level until a sufficient time required for the semiconductor switching device 500 to become the saturation state after the input signal HIN rises has elapsed.

Note that the filter function of the logic circuit 19 is preferably activated only when the input signal HIN rises, i.e., only during the turn-on operation period, while the filter function is preferably deactivated during the steady-on operation period in which the input signal HIN is already at the high level and is stabilized at the saturation voltage Vsat. This operation will be described in a period Tb2 and a period Te2 of the time chart of FIG. 5 described below.

The drive circuit 218 receives the input signal HIN and the signal Vpo. The drive circuit 218 is a circuit that generates the drive signal HO. When the drive circuit 218 generates the drive signal HO for turning on an off in synchronization with the input signal HIN when the signal Vpo is at the low level. Thus, switching of the semiconductor switching device 500 can be controlled based on the input signal HIN. On the other hand, when the input signal HIN is at the high level and the signal Vpo is at the high level, the drive circuit 18 sets the drive signal HO to the low level and holds the low level. Accordingly, the semiconductor switching device 500 is cut off, and the cut-off state is held. The short-circuit protection can be achieved by the cut-off operation.

FIGS. 5 and 6 are time charts each illustrating the operation of the semiconductor device driving circuit 100a according to the second embodiment of the present invention. The circuit operation of the second embodiment will be described with reference to a specific time chart. To avoid redundant explanations, the same components are denoted by the same reference numerals, and the description of the period corresponding to the period described above with reference to FIGS. 2 and 3 in the first embodiment is omitted.

FIG. 5 illustrates a time chart when a short-circuit occurs in the semiconductor switching device 500 during the ON operation. Like in the first embodiment, the time chart is started from the period Ta.

The period Tb2 is a period in which the input signal HIN rises and the detection voltage Vdesat falls to reach the first threshold Vdsth1. Since the logic circuit 19 does not cause the signal Vpo to rise during the predetermined filter time tf1. During the period Tb2, the signal Vpo is held at the low level. The filter time tf1 is designed to a length of time equal to or longer than a period required for the detection voltage Vdesat to fall and reach the first threshold Vdsth1. Thus, the signal Vcmpo can be sufficiently filtered, and erroneous detection during the turn-on operation period can be prevented.

During a period Tc2, the detection voltage Vdesat is lower than the first threshold Vdsth1 and the output signal Vcmpo from the comparator 13 falls. After a lapse of a predetermined second delay time tth2 after the output signal Vcmpo from the comparator 13 falls, the threshold is switched to Vdsth2. The length of the second delay time tth2 is set to a length of time sufficient for the detection voltage Vdesat to be lower than the first threshold Vdsth1 and then become lower than the second threshold Vdsth2.

Note that the starting point of the period Tc2 is a time when the detection voltage Vdesat becomes lower than the first threshold Vdsth1 before the collector-emitter voltage Vce reaches the saturation voltage Vsat. To compare with the period Tc2, FIG. 5 also illustrates the period Tc as the "steady-on operation period" described above with reference to FIG. 2.

After that, like in the first embodiment, the period Td arrives.

In the period Te2, the output signal Vcmpo from the comparator 13 rises in accordance with the detection voltage Vdesat which has become higher than the second threshold Vdsth2. When the logic circuit 19 sets the signal Vpo to the high level in response to a rising edge of the output signal Vcmpo, the output signal from the drive circuit 218 is held at the low level, the semiconductor switching device 500 becomes the cut-off state. This state is held until the signal Reset is input. After a lapse of a predetermined third delay time tth3 after the signal Vcmpo rises, the threshold is switched to Vdsth1. The length of the third delay time tth3 is set to a length of time sufficient for the detection voltage Vdesat to become higher than the second threshold Vdsth2 and then become higher than the first threshold Vdsth1.

Note that, as described above, the filter function of the logic circuit 19 is preferably activated only when the input signal HIN rises, i.e., only during the turn-on operation period, while the filter function is preferably deactivated during the steady-on operation period in which the input signal HIN is already at the high level and is stabilized at the saturation voltage Vsat. In the second embodiment, such a preferable mode is achieved. As illustrated in FIG. 5, the filter time Tf1 is activated in the period Tb2, while in the period Td, filtering is not performed and the signal Vpo immediately rises in synchronization with a rising edge of the signal Vcmpo. In the period Tb2, erroneous detection during the turn-on operation period can be prevented using the filter time Tf1. Further, in the period Td, the filter function is deactivated to thereby increase the sensitivity for detecting a short-circuit during the steady-on operation.

FIG. 6 illustrates a time chart when the semiconductor switching device 500 becomes a short-circuit state immediately after the semiconductor switching device is turned on. The periods Ta1 and Tc1 are similar to those illustrated in FIG. 3 of first embodiment, and thus descriptions thereof are omitted.

In a period Tb3, when the state where the signal Vcmpo is at the high level is held for the filter time tf1 or longer, the signal Vpo rises and the semiconductor switching device 500 performs the cut-off operation.

According to the second embodiment described above, like in the first embodiment, the threshold adjustment circuit 601 switches the threshold, thereby preventing erroneous detection during the turn-on operation period and improving the sensitivity for detecting a short-circuit during the steady-on operation.

Further, according to the second embodiment, the collector-emitter voltage of the semiconductor switching device 500 becomes equal to or less than the predetermined voltage, and after a lapse of the predetermined period, the threshold to be supplied to the comparator 13 can be reduced. Thus, switching of the threshold can be prevented from being executed when the semiconductor switching device turns on during the short-circuit operation (see FIG. 6). Consequently, unnecessary circuit operations can be reduced.

REFERENCE SIGNS LIST

10 desaturation detection terminal; 11 constant current source; 12 discharging NMOSFET; 13 comparator; 14 switch; 15 threshold source; 16,32 delay circuit; 17,19 logic circuit; 18,218 drive circuit; 21 first voltage source, 22 second voltage source; 31 current difference detection circuit; 40 resistor unit; 41 first resistor; 42 second resistor; 43 third resistor; 100,100a semiconductor device driving circuit (integrated circuit); 200,201 desaturation voltage detection circuit; 300 diode; 400 capacitive element; 500 semiconductor switching device; 600,601 threshold adjustment circuit

The invention claimed is:
1. A semiconductor device driving circuit comprising:
a desaturation voltage detection circuit detecting a voltage between a first electrode and a second electrode of a semiconductor switching device including the first electrode, the second electrode and a control electrode controlling conduction between the first electrode and the second electrode;
a threshold adjustment circuit outputting a threshold;
a comparator comparing the threshold with a detection voltage detected by the desaturation voltage detection circuit; and
a drive circuit generating a drive signal for driving the semiconductor switching device based on an input signal and maintaining the drive signal at a cut-off state when the detection voltage increases from a value lower than the threshold and reaches the threshold,
wherein the threshold adjustment circuit switches the threshold between a first voltage and a second voltage which is lower than the first voltage, outputs the first voltage as the threshold when the semiconductor switching device is in an off-state, and outputs the second voltage as the threshold when the semiconductor switching device is turned on and a voltage between the first electrode and the second electrode is a saturation voltage.

2. The semiconductor device driving circuit according to claim 1, wherein the threshold adjustment circuit switches the threshold from the first voltage to the second voltage after a lapse of a predetermined time from a time when the detection voltage decreases from a value higher than the threshold and reaches the threshold.

3. The semiconductor device driving circuit according to claim 2, wherein the threshold adjustment circuit switches the threshold from the second voltage to the first voltage after a lapse of a predetermined time from a time when the detection voltage increases from a value lower than the threshold and reaches the threshold.

4. The semiconductor device driving circuit according to claim 1, wherein the threshold adjustment circuit switches the threshold from the second voltage to the first voltage after a lapse of a predetermined time from a time when the detection voltage increases from a value lower than the threshold and reaches the threshold.

5. The semiconductor device driving circuit according to claim 1, wherein
the threshold adjustment circuit comprises a switch, a first voltage source, and a second voltage source, and
the switch operates to connect the first voltage source to the desaturation voltage detection circuit to output the first voltage as the threshold with the semiconductor switching device in the off-state, and connect the second voltage source to the desaturation voltage detection circuit to output the second voltage as the threshold with the semiconductor switching device turned on and the voltage between the first electrode and the second electrode at the saturation voltage.

* * * * *